United States Patent
Chen

(10) Patent No.: US 10,658,553 B2
(45) Date of Patent: May 19, 2020

(54) LIGHT SOURCE MODULE

(71) Applicant: Primax Electronics Ltd., Taipei (TW)

(72) Inventor: Chung-Yuan Chen, Taipei (TW)

(73) Assignee: PRIMAX ELECTRONICS LTD., Taipei (TW)

( * ) Notice: Subject to any disclaimer, the term of this patent is extended or adjusted under 35 U.S.C. 154(b) by 0 days.

(21) Appl. No.: 16/195,324

(22) Filed: Nov. 19, 2018

(65) Prior Publication Data

US 2019/0229245 A1 Jul. 25, 2019

Related U.S. Application Data

(60) Provisional application No. 62/621,918, filed on Jan. 25, 2018.

(51) Int. Cl.
| | |
|---|---|
| *H01L 51/50* | (2006.01) |
| *H01L 33/54* | (2010.01) |
| *H01L 27/02* | (2006.01) |
| *H01L 29/866* | (2006.01) |
| *H01L 33/64* | (2010.01) |
| *H01L 33/32* | (2010.01) |
| *H01L 33/60* | (2010.01) |
| *H01L 33/62* | (2010.01) |
| *H01L 33/06* | (2010.01) |
| *H01L 33/58* | (2010.01) |
| *H01L 33/08* | (2010.01) |
| *H01L 25/16* | (2006.01) |
| *H01L 33/44* | (2010.01) |
| *H01L 33/20* | (2010.01) |
| *H01L 25/075* | (2006.01) |

(52) U.S. Cl.
CPC .......... *H01L 33/54* (2013.01); *H01L 27/0248* (2013.01); *H01L 29/866* (2013.01); *H01L 33/06* (2013.01); *H01L 33/32* (2013.01); *H01L 33/58* (2013.01); *H01L 33/60* (2013.01); *H01L 33/62* (2013.01); *H01L 33/647* (2013.01); *H01L 25/0753* (2013.01); *H01L 25/167* (2013.01); *H01L 33/08* (2013.01); *H01L 33/20* (2013.01); *H01L 33/44* (2013.01)

(58) Field of Classification Search
USPC ............. 438/22–47, 69, 493, 503, 507, 956; 257/13, 79–103, 918, 40, 642–643, 759
See application file for complete search history.

(56) References Cited

U.S. PATENT DOCUMENTS

2007/0139949 A1* 6/2007 Tanda ................ H01L 33/508
362/551

* cited by examiner

*Primary Examiner* — Moin M Rahman
(74) *Attorney, Agent, or Firm* — Kirton McConkie; Evan R. Witt

(57) ABSTRACT

A light source module includes a LED die, a supporting base and an encapsulation layer. The LED die emits a light beam. The supporting base is electrically connected with the LED die, and supports the LED die. After a portion of the light beam is projected to and reflected by the supporting base, the portion of the light beam is projected to surroundings through the LED die. The encapsulation layer covers the LED die and a portion of the supporting base to protect the LED die. The encapsulation layer includes a light-adjusting element. A light pattern of the light beam is adjustable according to a shape of the encapsulation layer.

8 Claims, 7 Drawing Sheets

LIGHT SOURCE MODULE

CROSS-REFERENCE TO RELATED APPLICATION

This application claims priority to U.S. Provisional Patent Application No. 62/621,918 filed Jan. 25, 2018, the contents of which are incorporated herein by reference.

FIELD OF THE INVENTION

The present invention relates to a light source module, and more particularly to a light source module with high luminous efficiency.

BACKGROUND OF THE INVENTION

Generally, a common light source uses a light emitting diode (LED) to generate a light beam. The illuminating principle of the light emitting diode will be described as follows. When a current is applied to a semiconductor material of Group III-V such as gallium nitride (GaN), gallium phosphide (GaP), gallium arsenide (GaAs) or indium phosphide (InP), electrons recombine with holes. Consequently, the extra energy is released from a multiple quantum well (MQW) in the form of photons, and the light beam visible to the eyes is generated.

The structure of a conventional LED die will be described as follows. FIG. 1 is a schematic cross-sectional view illustrating the structure of a conventional LED die. As shown in FIG. 1, the conventional LED die 1 has a multi-layered stack structure comprising a substrate 11, a P-type covering layer 12, a multiple quantum well 13, an N-type covering layer 14, a conducting film layer 15 (e.g., an ITO layer), a P-type electrode 16 and an N-type electrode 17. The P-type electrode 16 and the N-type electrode 17 are disposed on the top surface of the LED die 1. The P-type electrode 16 and the N-type electrode 17 are connected with wires according to a wire bonding process, which will be described later. The multiple quantum well 13 is disposed within the multi-layered stack structure. As mentioned above, the light beam of the LED die 1 is outputted from the multiple quantum well 13. Since the light beam is outputted upwardly from the multiple quantum well 13, a portion of the light beam is blocked and lost by the P-type covering layer 12, the conducting film layer 15, the P-type electrode 16 and the N-type electrode 17. Consequently, the overall luminous efficiency of the conventional LED die 1 to output the light beam upwardly is adversely affected. Generally, the overall luminance of the conventional LED die 1 is mainly dependent on the portion of the light beam leaked from the lateral side of the multiple quantum well 13. Consequently, the luminous efficiency of the conventional LED die 1 is not satisfied. In other words, the luminous efficiency of the conventional LED die 1 needs to be further improved.

FIG. 2 is a schematic cross-sectional view illustrating a light source module with the conventional LED die. The light source module 2 comprises a circuit board 21 and plural LED elements 22. The plural LED elements 22 are installed on the circuit board 21. For succinctness, only one LED element 22 is shown in FIG. 2. Each LED element 22 is electrically connected with the circuit board 21 to receive the current from the circuit board 21. Consequently, the LED element 22 emits a light beam. The light source module may be installed within an electronic device (not shown). Consequently, the electronic device has the function of outputting the light beam.

Generally, the light source modules are classified into two types. In the first type light source module, the circuit board 21 has a circuitry for controlling the operation of the LED element 22, and the electronic function of the electronic device to process associated electronic signals is implemented by another circuit board. In the second type light source module, the circuit board 21 has a circuitry for controlling the operation of the LED element 22, and the electronic function of the electronic device to process associated electronic signals is also implemented by the circuit board 21.

In the light source module 2, the LED element 22 is a package structure of a single LED die 1. In addition, the P-type electrode 16 and the N-type electrode 17 of the LED die 1 are connected with corresponding pins 211 of the circuit board 21 through wires 18. Consequently, the LED element 22 can receive the current from the circuit board 21. However, during the process of packaging the LED die 1, the LED die 1 is usually installed on a carrier plate 19. The volume of the carrier plate 19 and the retained height of the wires 18 are the main factors that increase the overall thickness of the package structure of the LED die 1. In other words, it is difficult to reduce the thickness of the light source module with the LED die 1. Of course, the increased thickness of the package structure of the LED die 1 is detrimental to the development of the electronic device toward small size and light weightiness.

With the improvement of technology and living quality, the user's or manufacturer's demands on the functions of the light source module are gradually increased. Basically, the light beam from the light source module provides the illuminating efficacy. In addition, the user or the manufacturer prefers that the light beam from the light source module has more applications. Consequently, some approaches were adopted. In accordance with an approach, an optical structure 23 (e.g., a photomask) is arranged in an optical path of the light beam from the LED element 22 of the conventional light source module. By the optical structure 23, the light beam from the LED element 22 undergoes a secondary optical treatment. For example, the secondary optical treatment includes a light-mixing operation, a light-guiding operation, a diffracting operation, a refracting operation, or the like. In such way, the light beam passing through the optical structure 23 generates a specified optical effect. As mentioned above, the constituents and the package structure of the conventional LED die 1 are detrimental to the miniaturization of the light source module. If the light source module is further equipped with the optical structure 23 to increase the optical effect, it is more difficult to reduce the thickness of the light source module.

Generally, the manufacturer of the light source module and the manufacturer of the LED element 22 are different. Consequently, the manufacturer of the light source module often commissions the manufacturer of the LED element 22 to fabricate the LED element 22 and proposes the required optical specifications. After the manufacturer of the light source module acquires the LED element 22 (i.e., the package structure of the LED die 1) from the manufacturer of the LED element 22, the LED element 22 and the circuit board 21 are combined together through a wire bonding process. Since the LED elements 22 are outsourced, some problems occur. For example, the materials of different LED elements 22 are somewhat different. In addition, the encapsulating materials of packaging the LED elements 22 are somewhat different. Due to the influences of these two factors, there is obvious color difference between different LED elements 22.

In other words, the conventional light source module with the light emitting diode needs to be further improved.

SUMMARY OF THE INVENTION

The present invention provides a light source module with reduced thickness and enhanced luminous efficiency.

In accordance with an aspect of the present invention, there is provided a light source module. The light source module includes a LED die, a supporting base and an encapsulation layer. The LED die emits a light beam. The supporting base is electrically connected with the LED die, and supports the LED die. After a portion of the light beam is projected to and reflected by the supporting base, the portion of the light beam is projected to surroundings through the LED die. The encapsulation layer covers the LED die and a portion of the supporting base to protect the LED die. A light pattern of the light beam is adjustable according to a shape of the encapsulation layer.

In an embodiment, the LED die includes a substrate, a first covering layer, a second covering layer and a luminous layer. The first covering layer is disposed on a bottom surface of the substrate and electrically connected with the supporting base. A first current flows through the first covering layer. The second covering layer is located under the first covering layer and electrically connected with the supporting base. A second current flows through the second covering layer. The luminous layer is arranged between the first covering layer and the second covering layer. The luminous layer emits the light beam in response to the first current and the second current. The light beam is projected to the surroundings through the substrate.

In an embodiment, the supporting base includes a plate body, a first metal connection layer, a second metal connection layer and a passivation layer. The first metal connection layer is disposed on a top surface of the plate body. The second metal connection layer is disposed on the first metal connection layer. The first metal connection layer and the second metal connection layer are combined together to reflect the light beam. The passivation layer is disposed on the second metal connection layer to protect the plate body, the first metal connection layer and the second metal connection layer. After the portion of the light beam projected to the supporting base is reflected by the passivation layer, the portion of the light beam is projected to the surroundings through the substrate.

The above objects and advantages of the present invention will become more readily apparent to those ordinarily skilled in the art after reviewing the following detailed description and accompanying drawings, in which:

DETAILED DESCRIPTION OF THE PREFERRED EMBODIMENT

For solving the drawbacks of the conventional technologies, the present invention provides a light source module. First of all, the structure of the light source module will be described as follows.

Figure 3:
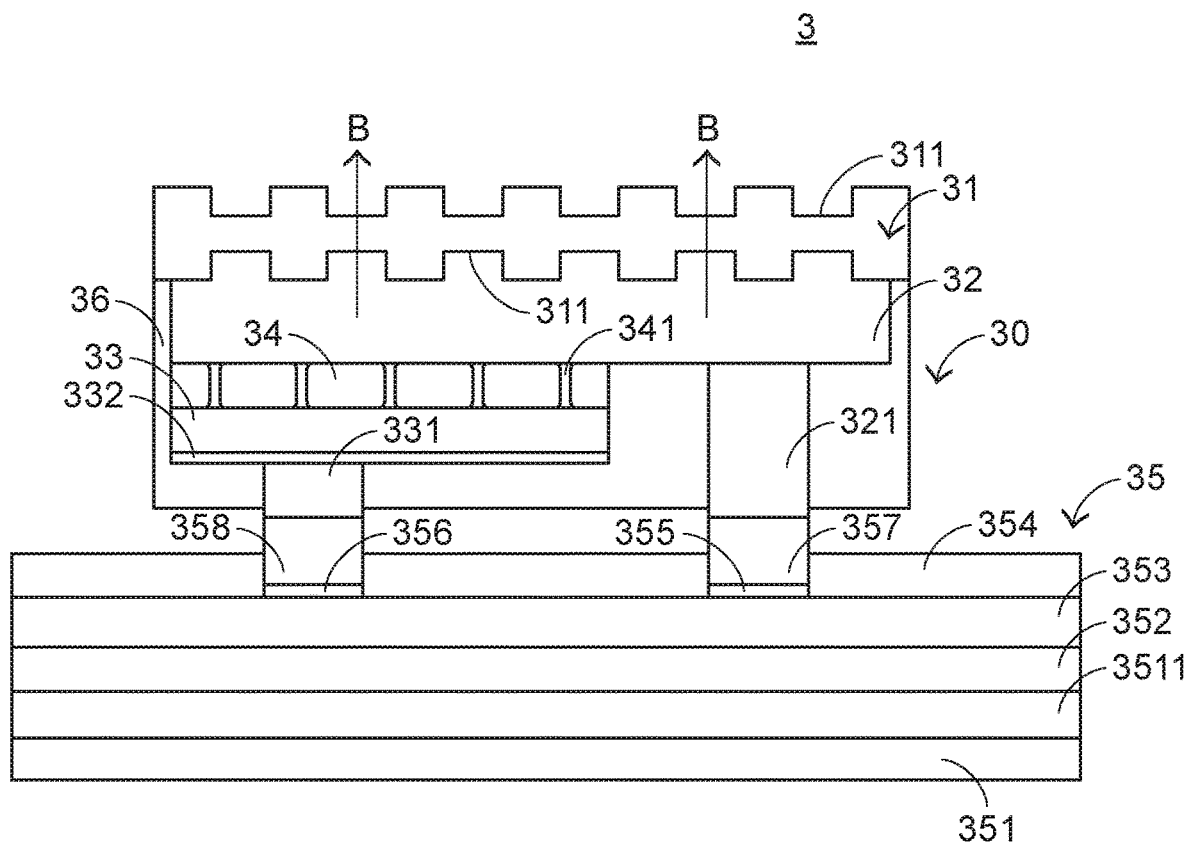
FIG. 3 is a schematic cross-sectional view illustrating a light source module according to a first embodiment of the present invention.

FIG. 3 is a schematic cross-sectional view illustrating a light source module according to a first embodiment of the present invention. As shown in FIG. 3, the light source module 3 comprises a substrate 31, a first covering layer 32, a second covering layer 33, a luminous layer 34, a supporting base 35 and a first passivation layer 36. The first covering layer 32 is disposed on the bottom surface of the substrate 31 for allowing a first current to go through. The second covering layer 33 is located under the first covering layer 32 for allowing a second current to go through. The luminous layer 34 is arranged between the first covering layer 32 and the second covering layer 33. In response to the first current and the second current, the luminous layer 34 emits a light beam B. After the light beam B is transmitted through the substrate 31, the light beam B is projected to the surroundings. The first covering layer 32, the second covering layer 33 and the luminous layer 34 are stack structures that are formed of semiconductor material of Group III-V. In addition, electrons recombine with holes to generate the light beam B. In an embodiment, the first covering layer 32 is an N-GaN covering layer, the second covering layer 33 is a P-GaN covering layer, and the luminous layer 34 is a multiple quantum well.

Figure 4:
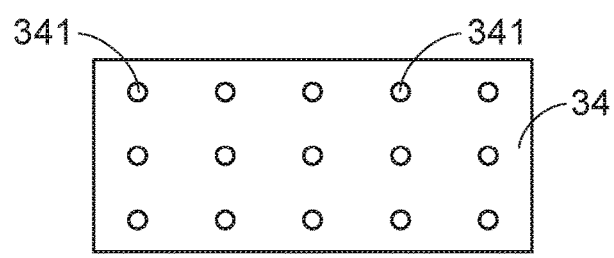
FIG. 4 is a schematic top view illustrating the luminous layer of the light source module according to the first embodiment of the present invention.

Please refer to FIGS. 3 and 4. FIG. 4 is a schematic top view illustrating the luminous layer of the light source module according to the first embodiment of the present invention. The luminous layer 34 comprises plural openings 341. The plural openings 341 are uniformly distributed in the luminous layer 34. Moreover, the plural openings 341 run through the top surface of the luminous layer 34 and the bottom surface of the luminous layer 34. Since the plural openings 341 are uniformly distributed, the density of the first current and the density of the second current are more uniform. Consequently, the light beam B is uniformly outputted from the luminous layer 34.

The substrate 31 comprises plural microstructures 311, which are formed on the top surface and the bottom surface of the substrate 31. Due to the microstructures 311, the total internal reflection of the light beam B within the substrate 31 will be avoided. In other words, the arrangement of the microstructures 311 can facilitate projecting the light beam B to the surroundings through the substrate 31. In this embodiment, the microstructures 311 are formed on the top surface and the bottom surface of the substrate 31 by using any other appropriate method (e.g., an etching process). Moreover, the first covering layer 32 comprises a first contact pad 321, and the second covering layer 33 comprises a second contact pad 331. The first contact pad 321 is disposed on the bottom surface of the first covering layer 32 and electrically connected with the first covering layer 32. The second contact pad 331 is disposed on the bottom surface of the second covering layer 33 and electrically connected with the second covering layer 33. Preferably, the second covering layer 33 further comprises a transparent conductive layer 332. The transparent conductive layer 332 is disposed on the bottom surface of the second covering layer 33 for assisting in the electric conduction of the second covering layer 33.

In this embodiment, a LED die 30 is defined by the substrate 31, the first covering layer 32, the second covering layer 33, the luminous layer 34 and the first passivation layer 36 collaboratively. After the LED die 30 and the supporting base 35 are combined together, the light source module 3 is produced.

Please refer to FIG. 3 again. The supporting base 35 is electrically connected with the first covering layer 32 and the second covering layer 33. In addition, the supporting base 35 comprises a plate body 351, a first metal connection layer 352, a second metal connection layer 353, a second passivation layer 354, a first electrode 355, a second electrode 356, a first metallic coupling block 357 and a second metallic coupling block 358. The first metal connection layer 352 is disposed on the top surface of the plate body 351. The second metal connection layer 353 is disposed on the first metal connection layer 352. The second metal connection layer 353 and the first metal connection layer 352 are combined together to reflect the light beam B. The second passivation layer 354 is disposed on the second metal connection layer 353 for protecting the plate body 351, the first metal connection layer 352 and the second metal connection layer 353. In addition, the portion of the light beam B projected to the supporting base 35 can be reflected by the second passivation layer 354. Consequently, the light beam B is projected to the surroundings through the substrate 31. The first electrode 355 is disposed on the second metal connection layer 353. The second electrode 356 is also disposed on the second metal connection layer 353. The first metallic coupling block 357 is disposed on the first electrode 355. Moreover, the first electrode 355 and the first contact pad 321 of the first covering layer 32 are combined with each other through the first metallic coupling block 357. Similarly, the second metallic coupling block 358 is disposed on the second electrode 356. Moreover, the second electrode 356 and the second contact pad 331 of the second covering layer 33 are combined with each other through the second metallic coupling block 358. In other words, the supporting base 35 is electrically connected with the first covering layer 32 and the second covering layer 33 through the first metallic coupling block 357 and the second metallic coupling block 358, respectively.

As shown in FIG. 3, the substrate 31, the first contact pad 321 and the second contact pad 331 are exposed outside the first covering layer 32, the second covering layer 33 and the luminous layer 34. The first contact pad 321 and the second contact pad 331 are fixed on the supporting base 35 or the conventional carrier plate 19 through a direct coupling process (e.g., a welding process or any other appropriate coupling process). That is, the electric connection of the light source module 3 is established without the need of performing the wire boning process. Consequently, the overall thickness of the light source module 3 is reduced. The reduction of the thickness is helpful to achieve the slimness benefit of the light source module 3. Moreover, the first covering layer 32, the first contact pad 321, the second covering layer 33, the second contact pad 331 and the luminous layer 34 are covered by the first passivation layer 36. Consequently, these components are protected by the first passivation layer 36.

The first contact pad 321 is electrically connected with the first electrode 355 through the first metallic coupling block 357. The second contact pad 331 is electrically connected with the second electrode 356 through the second metallic coupling block 358. Consequently, the wire bonding process is omitted. Moreover, the heat generated by the first contact pad 321 and the second contact pad 331 is directly transferred to the underlying supporting base 35 through thermal conduction. Moreover, the heat is dissipated to the surroundings through the supporting base 35. Since the supporting base 35 has a large area, the heat can be dissipated away more quickly. Since the heat is largely reduced, the loss of the luminous efficiency of the light source is reduced.

Preferably but not exclusively, the supporting base 35 is a flexible printed circuit board (FPC), a printed circuit board (PCB) or a copper plated resin board (PET). The flexible printed circuit board is formed by coating copper traces on a polyimide base (i.e., a PI base) and then performing a surface treatment. The printed circuit board is formed by coating copper traces on a fiberglass reinforced epoxy resin base (i.e., FR4 base) and then performing a surface treatment. The copper plated resin board is formed by coating copper traces on a polyethylene terephthalate base (i.e., PET base) and then performing a surface treatment.

In an embodiment, the first metallic coupling block 357 and the second metallic coupling block 358 are soldering material such as solder paste, silver paste, gold ball, solder ball or tin paste. The welding process includes but is not limited to a thermosonic process, a eutectic process or a reflow process. The first metal connection layer 352 is made of copper or a copper-like metallic material. The second metal connection layer 353 is made of gold, nickel, a gold-like metallic material or a nickel-like metallic material. Due to the properties of gold or nickel, the second metal connection layer 353 provides higher reflectivity and higher bonding capability.

The following four aspects should be specially described.

Firstly, a copper foil 3511 is disposed on the top surface of the plate body 351. Consequently, the top surface of the plate body 351 is not smooth. After the first metal connection layer 352 is formed on the top surface of the plate body 351, the top surface of the plate body 351 is smooth.

Secondly, the materials of the first metallic coupling block 357 and the second metallic coupling block 358 are not restricted as long as they are made of conductive metallic materials. That is, the first metallic coupling block 357 is not restrictedly made of copper, and the second metallic coupling block 358 is not restrictedly made of gold or nickel.

Thirdly, in a preferred embodiment, the substrate 31 is a transparent or translucent sapphire substrate. Consequently, the light beam B generated by the luminous layer 34 is transmitted upwardly through the substrate 31 without being blocked. In other words, the number of times the light beam is reflected and the light loss percentage will be reduced, and the luminous efficiency will be enhanced. Moreover, due to this arrangement, the overall light-outputting area of the light source module 3 is increased. Moreover, since the substrate 31 comprises the concave-convex microstructures 311, the light beam B generated by the light source module 3 will not undergo the total internal reflection within the substrate 31. Consequently, the light beam B can be directly projected to the surroundings through the substrate 31. Under this circumstance, the light-outputting efficiency of the light source module 3 is enhanced. The experiments indicates that the light-outputting efficiency of the light source module 3 is 1.6~3 times the light-outputting efficiency of the conventional light source module.

Fourthly, the second passivation layer 354 of the supporting base 35 is made of an insulating material, and the second metal connection layer 353, the first electrode 355 and the second electrode 356 are covered by the second passivation layer 354. Consequently, the junction between the first contact pad 321 and the first metallic coupling block 357 and the junction between the second contact pad 331 and the second metallic coupling block 358 will not generate the leakage current. Moreover, the second passivation layer 354 has the reflecting function. The portion of the light beam B that is projected downwardly will be reflected by the second passivation layer 354. Consequently, the light utilization efficiency is enhanced. In an embodiment, the second passivation layer 354 is an integral structure of an insulating material and a reflecting material. Alternatively, the insulating material and the reflecting material are separately formed as the second passivation layer 354.

Figure 5:
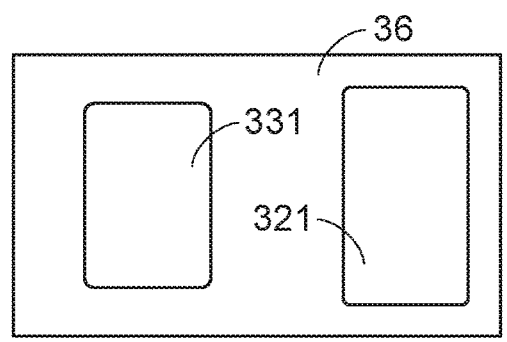
FIG. 5 is a schematic bottom view illustrating a portion of the light source module according to the first embodiment of the present invention.

Please refer to FIGS. 3 and 5. FIG. 5 is a schematic bottom view illustrating a portion of the light source module according to the first embodiment of the present invention. As shown in FIG. 3, the bottom surface of the first contact pad 321 and the bottom surface of the second contact pad 331 are at the same level so as to facilitate combining the first contact pad 321 and the second contact pad 331 with the supporting base 35. Moreover, a portion of the LED die 30 of the light source module 3 is shown in FIG. 5. As shown in FIG. 5, the areas of the first contact pad 321 and the second contact pad 331 occupy a large percentage of the bottom surface of the first passivation layer 36. The large areas of the first contact pad 321 and the second contact pad 331 are helpful for transferring the heat from the LED die 30 to the supporting base 35 through thermal conduction. Since the light source module 3 is not overheated, the luminous efficiency is not deteriorated.

Figure 6:
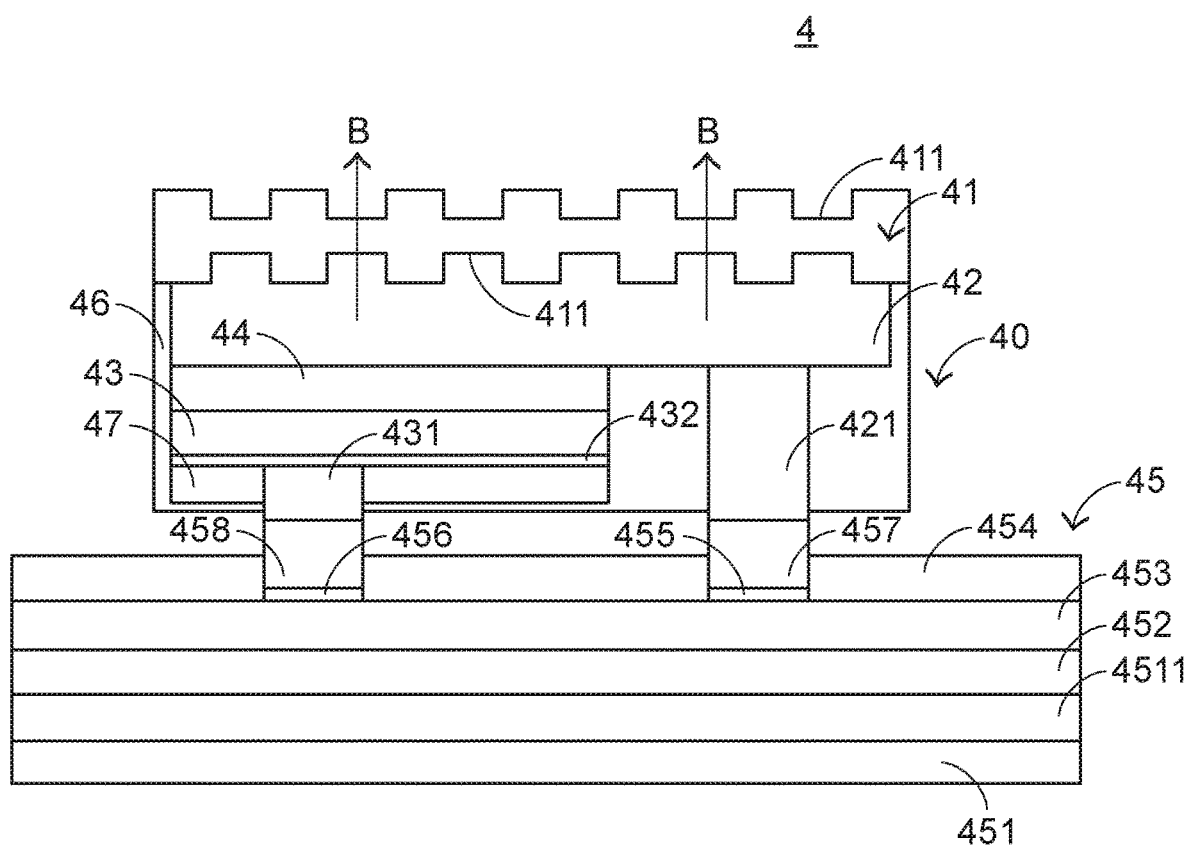
FIG. 6 is a schematic cross-sectional view illustrating a light source module according to a second embodiment of the present invention.

The present invention further provides a second embodiment, which is distinguished from the first embodiment. FIG. 6 is a schematic cross-sectional view illustrating a light source module according to a second embodiment of the present invention. As shown in FIG. 6, the light source module 4 comprises a substrate 41, a first covering layer 42, a second covering layer 43, a luminous layer 44, a supporting base 45, a first passivation layer 46 and a reflecting layer 47. The substrate 41 comprises plural microstructures 411. The first covering layer 42 comprises a first contact pad 421. The second covering layer 43 comprises a second contact pad 431 and a transparent conductive layer 432. The supporting base 45 comprises a plate body 451, a first metal connection layer 452, a second metal connection layer 453, a second passivation layer 454, a first electrode 455, a second electrode 456, a first metallic coupling block 457 and a second metallic coupling block 458. In this embodiment, a LED die 40 is defined by the substrate 41, the first covering layer 42, the second covering layer 43, the luminous layer 44 and the first passivation layer 46 collaboratively. After the LED die 40 and the supporting base 45 are combined together, the light source module 4 is produced. In comparison with the first embodiment, the light source module 4 further comprises the reflecting layer 47. The structures and functions of the other components of the light source module 4 are similar to those of the first embodiment, and are not redundantly described herein.

The reflecting layer 47 is disposed on the bottom surface of the second covering layer 43. The portion of the light beam B transmitted through the second covering layer 43 can be reflected by the reflecting layer 47. Consequently, the light beam B is projected to the surroundings through the substrate 41, and the light utilization efficiency is enhanced. In case that the second covering layer 43 comprises the transparent conductive layer 432, the reflecting layer 47 is disposed on the bottom surface of the transparent conductive layer 432. In other words, the light source module of this embodiment is equipped with a distributed Bragg reflector (DBR) between the luminous layer 44 and the supporting base 45. Consequently, the light-outputting efficiency of the light source module of this embodiment is increased when compared with the conventional light source module.

Figure 7:
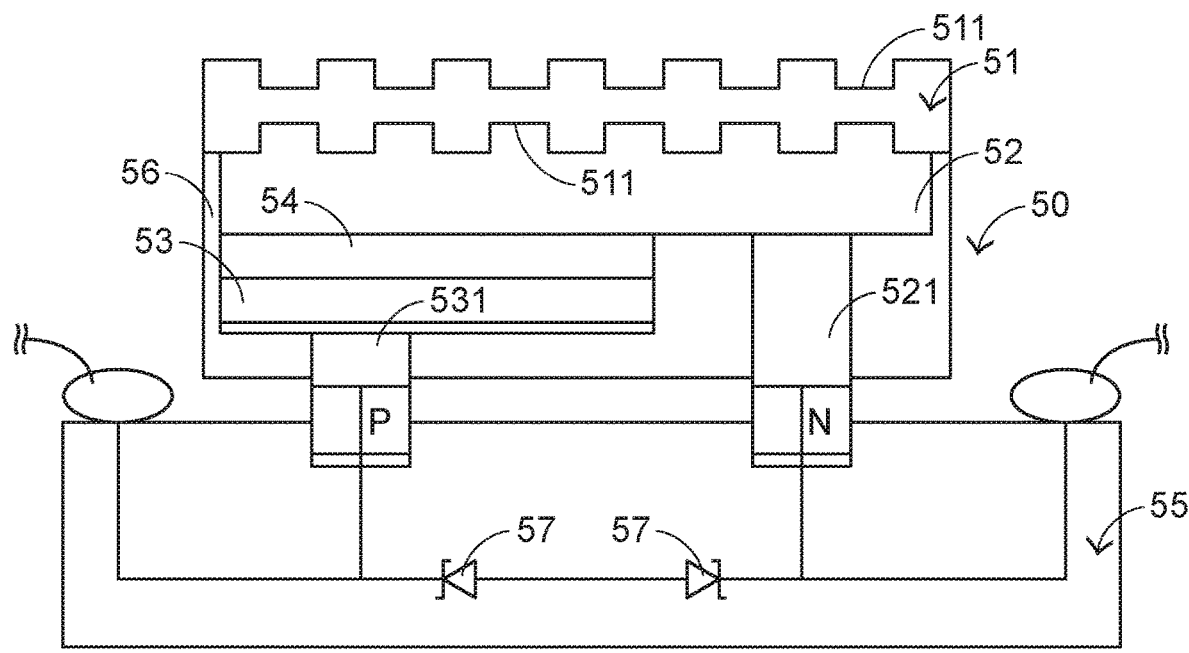
FIG. 7 is a schematic cross-sectional view illustrating a light source module according to a third embodiment of the present invention.

The present invention further provides a third embodiment, which is distinguished from the above embodiments. FIG. 7 is a schematic cross-sectional view illustrating a light source module according to a third embodiment of the present invention. As shown in FIG. 7, the light source module 5 comprises a substrate 51, a first covering layer 52, a second covering layer 53, a luminous layer 54, a supporting base 55, a first passivation layer 56 and plural Zener diodes 57. The substrate 51 comprises plural microstructures 511. The first covering layer 52 comprises a first contact pad 521. The second covering layer 53 comprises a second contact pad 531 and a transparent conductive layer 532. In this embodiment, a LED die 50 is defined by the substrate 51, the first covering layer 52, the second covering layer 53, the luminous layer 54 and the first passivation layer 56 collaboratively. After the LED die 50 and the supporting base 55 are combined together, the light source module 5 is produced. In comparison with the above embodiments, the light source module 5 further comprises the plural Zener diodes 57. The plural Zener diodes 57 are disposed on the supporting base 55. Moreover, the Zener diodes 57 and the luminous layer 54 are in inverse-parallel connection to form an electrostatic discharge (ESD) protection circuit. Consequently, the light source module is protected. The structures and functions of the other components of the light source module 5 are similar to those of the above embodiments, and are not redundantly described herein.

Figure 8:
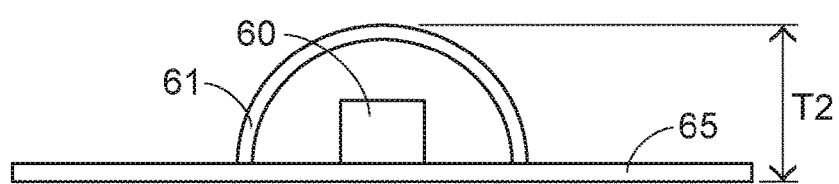
FIG. 8 is a schematic cross-sectional view illustrating a light source module according to a fourth embodiment of the present invention after being packaged.

FIG. 8 is a schematic cross-sectional view illustrating a light source module according to a fourth embodiment of the present invention after being packaged. As shown in FIG. 8, the LED die 60 is disposed on a supporting base 65. In addition, a protective glue 61 is sprayed on the LED die 60 and the supporting base 65. The process of spraying the protective glue 61 is similar to the packaging process in order to protect the LED die 60. In this embodiment, the LED die 60 is defined by the substrate, the first covering layer, the second covering layer, the luminous layer and the first passivation layer collaboratively. After the LED die 60 and the supporting base 65 are combined together, the light source module 6 is produced.

Figure 1:
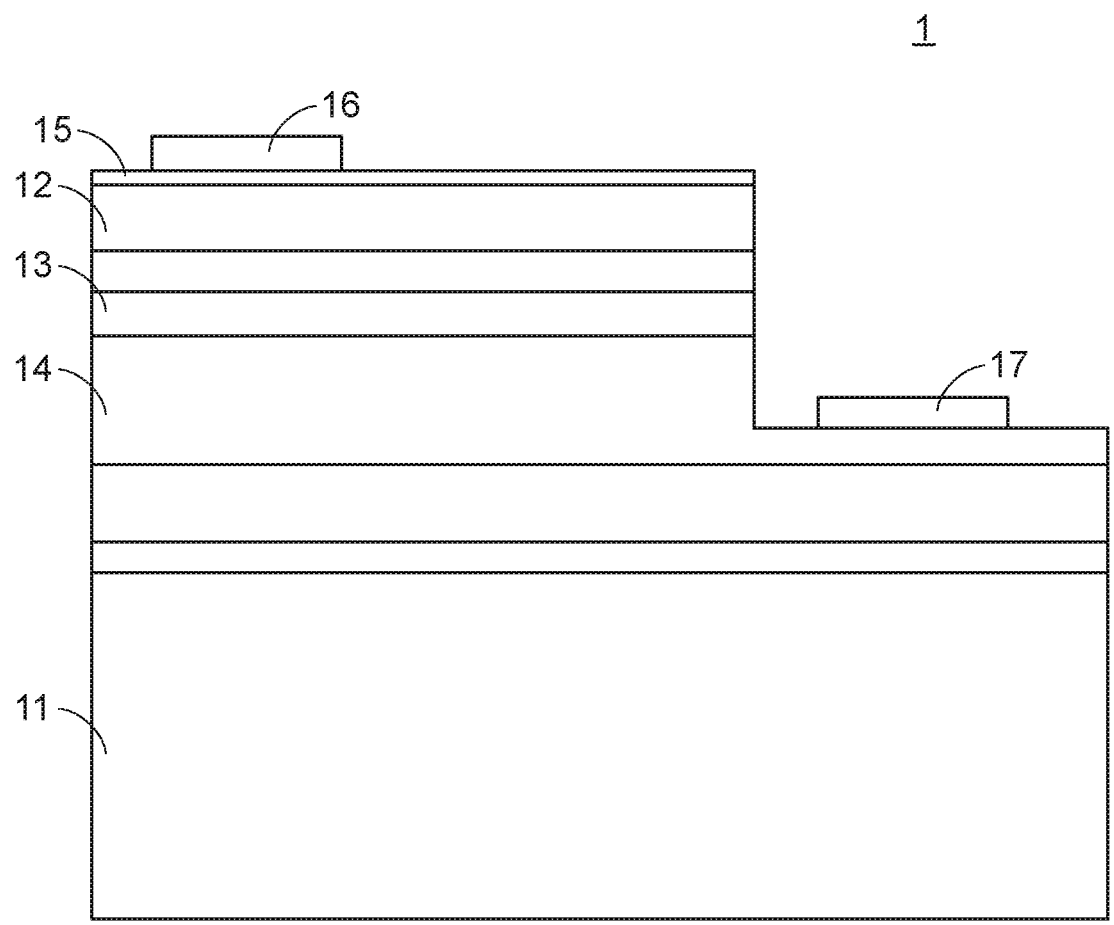
FIG. 1 is a schematic cross-sectional view illustrating the structure of a conventional LED die.
Figure 2:
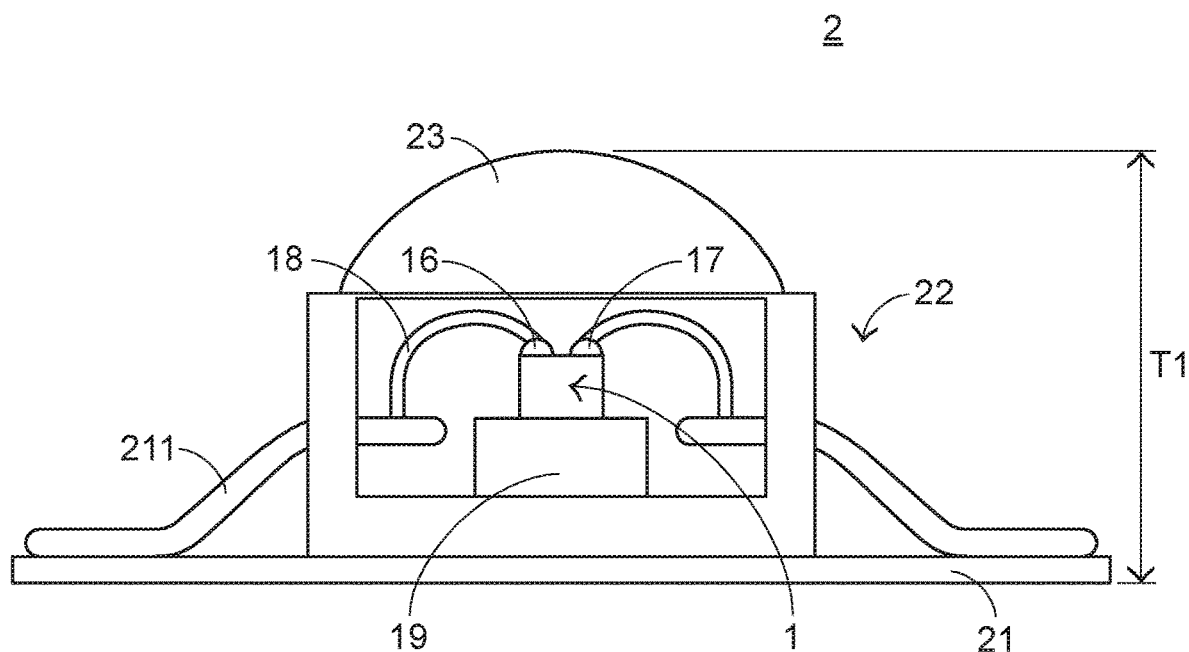
FIG. 2 is a schematic cross-sectional view illustrating a light source module with the conventional LED die.

Please refer to FIG. 2 again. According to the conventional technology of installing the light source on the circuit board 21, the LED element 22 (i.e., the package structure of the LED die 1) is placed on the circuit board 21, and the LED element 22 and the circuit board 21 are connected with each other through wires 18 so as to form the light source module 2. The light source module 2 has a thickness T1. According to the present invention, the constituents of the LED die 60 are modified. Consequently, the LED die 60 is directly welded on the supporting base 65 without the need of using the wire bonding process. That is, the packaging process (e.g., the process of spraying the protective glue 61) can be simply performed to produce the light source module 6. As shown in FIG. 7, the light source module 6 has a thickness T2. As mentioned above, the LED die 60 of the present invention is distinguished from the conventional LED die 1. Since the thickness T2 of the light source module 6 is much smaller than the thickness T1 of the light source module 2, the thickness of the light source module of the present invention is effectively reduced.

The package structures of some exemplary light source modules will be described as follows in more details.

Figure 9:
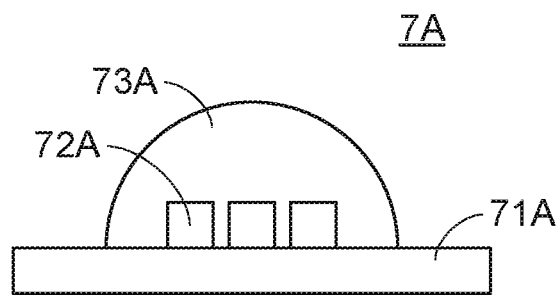
FIG. 9 is a schematic cross-sectional view illustrating a light source module according to a fifth embodiment of the present invention after being packaged.

FIG. 9 is a schematic cross-sectional view illustrating a light source module according to a fifth embodiment of the present invention after being packaged. As shown in FIG. 9, the light source module 7A comprises a supporting base 71A, plural LED dies 72A and an encapsulation layer 73A. The plural LED dies 72A are electrically connected with the supporting base 71A. The structure of each LED die 72A is similar to the structure of the LED die 30, 40, 50 or 60, and is not redundantly described herein. In the embodiment of FIG. 9, the light source module 7A comprises a group of three LED dies 72A.

In an embodiment, the light source module 7A is a stand-alone device. Alternatively, the light source module 7A is installed in an electronic device (not shown). Consequently, the electronic device has the function of emitting the light beam. According to the functions, the supporting base 71A is classified into two types. In accordance with the first type, the supporting base 71A has a circuitry for controlling the operations of the LED dies 72A. For example, the supporting base 71A provides the driving current to the LED dies 72A. The electronic function of the electronic device to process associated electronic signals is implemented by a circuit board of the electronic device. In accordance with the second type, the supporting base 71A has a circuitry for controlling the operations of the LED dies 72A, and the electronic function of the electronic device to process associated electronic signals is also implemented by the supporting base 71A. It is noted that the applications of the light source module 7A and the functions of the supporting base 71A are not restricted.

In the light source module 7A, the LED dies 72A are disposed on the supporting base 71A and covered by the encapsulation layer 73A. Consequently, the purpose of protecting the plural LED dies 72A is achieved. More especially, the light pattern of the light beam is adjusted according to the shape of the encapsulation layer 73A. As a consequence, the light beam with the light pattern corresponding to the shape of the encapsulation layer 73A is generated. In this embodiment, the encapsulation layer 73A has a dome shape. When the light beam is projected to the encapsulation layer 73A, the light pattern of the light beam is changed by the encapsulation layer 73A. That is, a light pattern similar to the light pattern from a spotlight (e.g., a light-pillar light pattern) is generated according to the shape of the encapsulation layer 73A. Consequently, the luminous effect of the spotlight is provided.

The encapsulation layer 73A is formed on the supporting base 71A and the plural LED dies 72A by a printing process, a coating process, a spraying process or any other appropriate process. Consequently, the encapsulation layer 73A is slim. The method of fabricating the conventional light source module 2 (see FIG. 2) comprises the steps of packaging a single LED die 1 as a LED element 22 and then packaging the LED element 22 as the light source module. When compared with the conventional light source module, the light source module 7A fabricated by the method of the present invention has reduced thickness and better luminous efficacy. In another embodiment, the thickness of the encapsulation layer 73A is adjusted according to the practical requirements. Consequently, the light pattern, the beam angle and the light-mixing efficacy of the light beam from the light source module 7A are adjustable.

Figure 10:
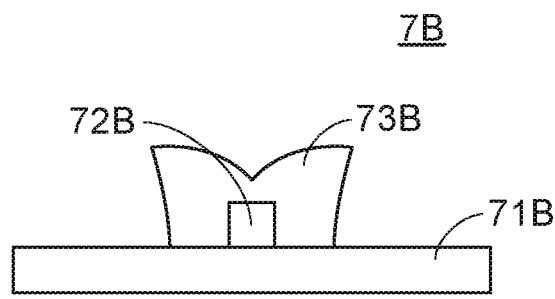
FIG. 10 is a schematic cross-sectional view illustrating a light source module according to a sixth embodiment of the present invention after being packaged.

Another type of light source module will be described as follows. FIG. 10 is a schematic cross-sectional view illustrating a light source module according to a sixth embodiment of the present invention after being packaged. As shown in FIG. 10, the light source module 7B comprises a supporting base 71B, plural LED dies 72B and an encapsulation layer 73B. The functions of the other components of the light source module 7B are similar to those of the light source module 7A, and are not redundantly described herein. In comparison with the first embodiment, the following two aspects are distinguished.

Firstly, the encapsulation layer 73B in this embodiment has a valley shape. When the light beam is projected to the encapsulation layer 73B, the light pattern of the light beam is changed by the encapsulation layer 73B. Consequently, the light pattern corresponding to a uniform light is generated according to the shape of the encapsulation layer 73B. In this way, the uniform luminous effect is provided. The uniform light pattern indicates that the luminance in the middle region of the light pattern and the luminance in the periphery region of the light pattern are very close.

Secondly, the number of the LED dies 72B covered by the encapsulating material and disposed on the supporting base 71B may be varied according to the practical requirements. As shown in FIG. 9, the light source module 7A comprises a greater number of LED dies 72A (or one LED die). As shown in FIG. 10, the light source module 7B comprises less number of LED dies (or one LED die) 72B. For example, in the embodiment of FIG. 10, the light source module 7B comprises one LED die 72B. It is noted that the number of the LED dies is not restricted. In case that several tens to several hundreds of LED dies are installed in the encapsulation layer, the light source module may be considered as a surface light source module. Consequently, the light source module with the desired functions can be easily produced according to the practical requirements.

Figure 11:
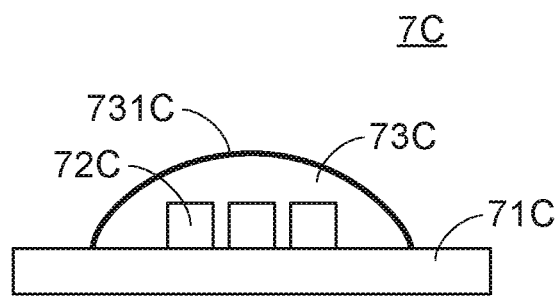
FIG. 11 is a schematic cross-sectional view illustrating a light source module according to a seventh embodiment of the present invention after being packaged.

Another type of light source module will be described as follows. FIG. 11 is a schematic cross-sectional view illustrating a light source module according to a seventh embodiment of the present invention after being packaged. As shown in FIG. 11, the light source module 7C comprises a supporting base 71C, plural LED dies 72C and an encapsulation layer 73C. In comparison with the first embodiment, the encapsulation layer 73C further comprises a reflective structure 731C. The functions of the other components of the light source module 7C are similar to those of the light source module 7A, and are not redundantly described herein. The reflective structure 731C is disposed on a top surface of the encapsulation layer 73C. In this embodiment, the encapsulation layer 73C has a hill shape. When the light beam is projected to the reflective structure 731C of the encapsulation layer 73C, the light beam is reflected by the reflective structure 731C and thus the travelling direction of the light beam is changed. For example, the travelling direction of the light beam is changed from a Z-axis direction to the X-axis direction and the Y-axis direction. That is, the light beam is outputted from the peripheries of the light source module 7C.

Figure 12:
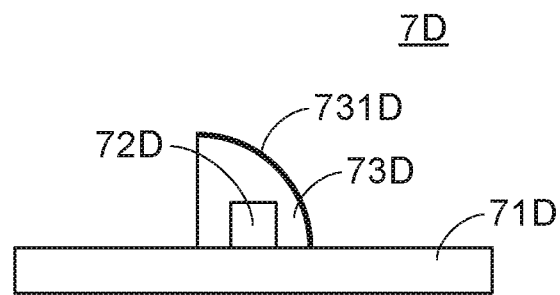
FIG. 12 is a schematic cross-sectional view illustrating a light source module according to an eighth embodiment of the present invention after being packaged.

Another type of light source module will be described as follows. FIG. 12 is a schematic cross-sectional view illustrating a light source module according to an eighth embodiment of the present invention after being packaged. As shown in FIG. 12, the light source module 7D comprises a supporting base 71D, a LED die 72D and an encapsulation layer 73D. The encapsulation layer 73D further comprises a reflective structure 731D. In comparison with the light source module 7C of the above embodiment, the following two aspects are distinguished. Firstly, the light source module 7D comprises one LED die 72D only. Consequently, the single LED die 72D is covered by the encapsulation layer 73D. Secondly, the shape of the encapsulation layer 73D is distinguished. The functions of the other components of the light source module 7D are similar to those of the light source module 7C, and are not redundantly described herein. In this embodiment, the shape of the encapsulation layer 73D is nearly a quarter-ball shape. The reflective structure 731D is formed on a top surface of the encapsulation layer 73D. In addition, the top surface of the encapsulation layer 73D is a curvy surface. That is, a portion of the encapsulation layer 73D has the curvy surface. When the light beam is projected to the reflective structure 731D on the top surface of the encapsulation layer 73D, the light beam is reflected by the reflective structure 731D and thus the travelling direction of the light beam is changed. As shown in FIG. 12, the light beam is outputted from the left side of the encapsulation layer 73D.

Figure 13:
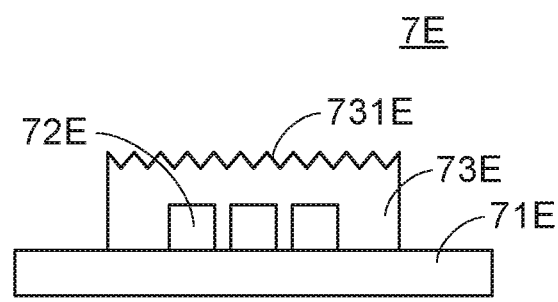
FIG. 13 is a schematic cross-sectional view illustrating a light source module according to a ninth embodiment of the present invention after being packaged.

Another type of light source module will be described as follows. FIG. 13 is a schematic cross-sectional view illustrating a light source module according to a ninth embodiment of the present invention after being packaged. As shown in FIG. 13, the light source module 7E comprises a supporting base 71E, plural LED dies 72E and an encapsulation layer 73E. The encapsulation layer 73E further comprises plural microstructures 731E. In comparison with the light source module 7A of the first embodiment, the encapsulation layer 73E further comprises the plural microstructures 731E, and the plural microstructures 731E are disposed on a top surface of the encapsulation layer 73E. The functions of the other components of the light source module 7E are similar to those of the light source module 7A, and are not redundantly described herein. For example, the plural microstructures 731E are formed on the top surface of the encapsulation layer 73E by a molding technology (e.g., a nanoimprint lithography technology). When the light beam is projected to the microstructures 731E of the encapsulation layer 73C, the travelling direction of the light beam and the light pattern of the light beam are changed. As long as the desired light pattern is generated and the travelling direction of the light beam is controlled according to the practical requirements, the examples of the microstructures 731E are not restricted.

In the embodiment of FIG. 13, the light source module 7E comprises three LED dies 72E. The three LED dies 72E include a red LED die, a green LED die and a blue LED die. That is, the light source module 7E is a three-color (RGB) light source. Due to the structure of the encapsulation layer 73E, the light beams from the three-color (RGB) light source are mixed in the encapsulation layer 73E. Consequently, the light beams with different color temperatures can be generated.

From the above descriptions, the shape of the encapsulation layer in the light source module of the present invention may be varied according to the practical requirements. Consequently, the light beam with the desired light pattern and travelling direction is generated. In addition, the structure and the packaging process of the light source module are simplified when compared with the conventional light source module. Consequently, the manufacturer of the light source module can directly implement the process of packaging the light emitting diodes (or the conventional LED die) without the need of commissioning the manufacturer of the light emitting diode to perform the packaging process. The manufacturing process of the light source module of the present invention has the following two advantages. Firstly, the manufacturer of the light source module can perform a color-selecting process to select the light emitting diodes in the same color zone and package these light emitting diodes as the light source module. Consequently, the color difference between different LED elements can be minimized. Secondly, it is not necessary to commission the manufacturer of the light emitting diodes to perform the packaging process. Since the designs about the architecture and structure of the light source module are not leaked out, the efficacy of keeping commercial confidence is achieved.

In the light source module of the present invention, the LED die is directly packaged by the encapsulation layer. The process of forming the encapsulation layer may be considered as a primary optical treatment. The encapsulation layer is a primary optical lens to provide a desired optical effect. As previously described, the conventional light source module has to be equipped with a secondary optical lens. When compared with the conventional light source module, the light source module of the present invention has reduced volume and slim appearance.

While the invention has been described in terms of what is presently considered to be the most practical and preferred embodiments, it is to be understood that the invention needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:
1. A light source module, comprising:
a LED die emitting a light beam;
a supporting base electrically connected with the LED die, and supporting the LED die, wherein after a portion of the light beam is projected to and reflected by the supporting base, the portion of the light beam is projected to surroundings through the LED die; and
an encapsulation layer covering the LED die and a portion of the supporting base to protect the LED die, wherein a light pattern of the light beam is adjustable according to a shape of the encapsulation layer,
wherein the LED die comprises:
a substrate;
a first covering layer disposed on a bottom surface of the substrate and electrically connected with the supporting base, wherein a first current flows through the first covering layer;
a second covering layer located under the first covering layer and electrically connected with the supporting base, wherein a second current flows through the second covering layer; and a luminous layer arranged between the first covering layer and the second covering layer, wherein the luminous layer emits the light beam in response to the first current and the second current, and the light beam is projected to the surroundings through the substrate, wherein the supporting base comprises:

a plate body;

a first metal connection layer disposed on a top surface of the plate body;

a second metal connection layer disposed on the first metal connection layer, wherein the first metal connection layer and the second metal connection layer are combined together to reflect the light beam; and a passivation layer disposed on the second metal connection layer to protect the plate body, the first metal connection layer and the second metal connection layer, wherein after the portion of the light beam projected to the supporting base is reflected by the passivation layer, the portion of the light beam is projected to the surroundings through the substrate.

2. The light source module according to claim 1, wherein the first covering layer comprises a first contact pad, and the second covering layer comprises a second contact pad, wherein the first contact pad is disposed on a bottom surface of the first covering layer and electrically connected with the first covering layer, and the second contact pad is disposed on a bottom surface of the second covering layer and electrically connected with the second covering layer.

3. The light source module according to claim 1, wherein the supporting base further comprises:

a first electrode disposed on the second metal connection layer;

a second electrode disposed on the second metal connection layer;

a first metallic coupling block disposed on the first electrode, wherein the first electrode and the first contact pad are combined with each other through the first metallic coupling block; and a second metallic coupling block disposed on the second electrode, wherein the second electrode and the second contact pad are combined with each other through the second metallic coupling block.

4. The light source module according to claim 1, wherein the light source module further comprises a reflecting layer, which is disposed on a bottom surface of the second covering layer, wherein when a portion of the light beam transmitted through the second covering layer is reflected by the reflecting layer, the portion of the light beam is projected to the surroundings through the substrate.

5. The light source module according to claim 1, wherein the encapsulation layer has a dome shape, wherein when the light beam is projected to the encapsulation layer, a light pattern of the light beam is changed by the encapsulation layer and the light pattern corresponding to a spotlight is generated.

6. The light source module according to claim 1, wherein the encapsulation layer has a valley shape, wherein when the light beam is projected to the encapsulation layer, a light pattern of the light beam is changed by the encapsulation layer and a light pattern corresponding to a uniform light is generated.

7. The light source module according to claim 1, wherein the encapsulation layer comprises a reflective structure, wherein the reflective structure is formed on a top surface of the encapsulation layer, and the top surface of the encapsulation layer is a curvy surface, wherein when the light beam is projected to the top surface of the encapsulation layer, the light beam is reflected by the encapsulation layer and a travelling direction of the light beam is changed by the encapsulation layer.

8. The light source module according to claim 1, wherein the encapsulation layer further comprises plural microstructures, which are disposed on a top surface of the encapsulation layer, wherein when the light beam is projected to the top surface of the encapsulation layer, a travelling direction and a light pattern of the light beam are changed by the encapsulation layer.

\* \* \* \* \*